United States Patent
Ranade et al.

(10) Patent No.: US 8,394,687 B2
(45) Date of Patent: Mar. 12, 2013

(54) ULTRA-ABRUPT SEMICONDUCTOR JUNCTION PROFILE

(75) Inventors: Pushkar Ranade, Hillsboro, OR (US); Keith Zawadzki, Portland, OR (US); Leif Paulson, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 40 days.

(21) Appl. No.: 11/694,936

(22) Filed: Mar. 30, 2007

(65) Prior Publication Data

US 2008/0237661 A1 Oct. 2, 2008

(51) Int. Cl.
*H01L 21/336* (2006.01)
(52) U.S. Cl. ....................................................... 438/197
(58) Field of Classification Search .................... 438/197
See application file for complete search history.

(56) References Cited

U.S. PATENT DOCUMENTS

| | | | |
|---|---|---|---|
| 2006/0014366 A1* | 1/2006 | Currie | 438/517 |
| 2006/0148220 A1* | 7/2006 | Lindert et al. | 438/514 |
| 2007/0119546 A1 | 5/2007 | Collins et al. | |
| 2007/0238234 A1* | 10/2007 | Wang et al. | 438/197 |
| 2007/0298557 A1* | 12/2007 | Nieh et al. | 438/197 |
| 2008/0099794 A1* | 5/2008 | Beyer et al. | 257/255 |

* cited by examiner

*Primary Examiner* — Shaun Campbell
(74) *Attorney, Agent, or Firm* — Winkle, PLLC

(57) ABSTRACT

The present invention discloses a method including: providing a substrate; forming recessed regions adjacent to both sides of a gate on the substrate; performing an angled co-implant of a species in two steps with two different energies and two different doses into the recessed regions; forming Silicon-Germanium in the recessed regions; forming source/drain extensions adjacent to both sides of the gate with a dopant; and performing an anneal to activate the dopant.

9 Claims, 2 Drawing Sheets

ULTRA-ABRUPT SEMICONDUCTOR JUNCTION PROFILE

BACKGROUND OF THE INVENTION

1. Field of the Invention

The present invention relates to a field of semiconductor integrated circuit (IC) manufacturing, and more specifically, to an apparatus for and a method of forming an ultra-abrupt semiconductor junction profile.

2. Discussion of Related Art

Continual shrinking of a complementary metal-oxide-semiconductor (CMOS) integrated circuit (IC) as exemplified in the well-known Moore's Law requires a formation of an ultra-abrupt semiconductor junction. In a case of a PMOS transistor in the CMOS IC, a source/drain region and its extension must have a very high Boron concentration with an extremely abrupt Boron profile. In the analogous case of an NMOS transistor in the CMOS IC, the source/drain region and its extension must have a very high Arsenic or Phosphorus concentration with an extremely abrupt Arsenic profile.

A p+/n semiconductor junction may be formed by ion implanting a p-type dopant, such as Boron, into an n-type substrate, such as Arsenic-doped Silicon, followed by annealing the substrate at over 1,000 degrees C. The NMOS transistor requires a high anneal temperature to activate the dopant. Unfortunately, the use of such a high temperature results in a significant out-diffusion of the dopant into the substrate in the PMOS transistor.

Thus, a need exists for an apparatus of and a method of forming an ultra-abrupt semiconductor junction profile.

DETAILED DESCRIPTION OF THE PRESENT INVENTION

Figure 1:
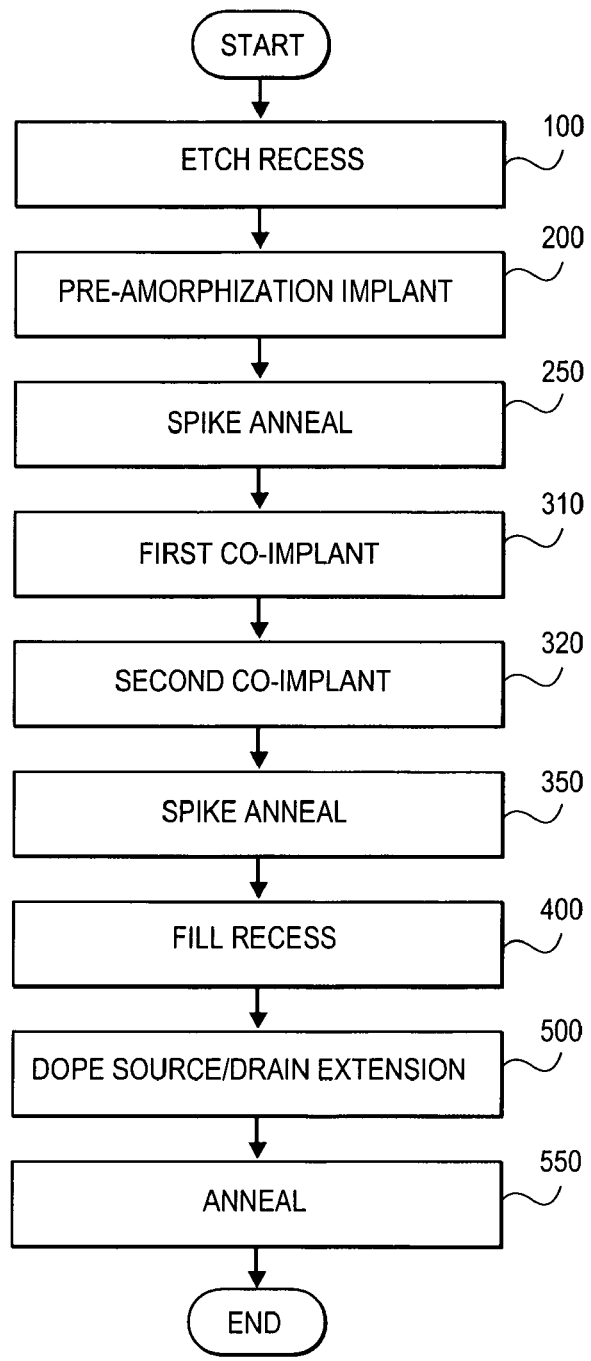
FIG. 1 is a flowchart of a method of forming an ultra-abrupt semiconductor junction profile according to an embodiment of the present invention.

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

The present invention describes an apparatus for and a method of forming an ultra-abrupt semiconductor junction profile in a device, such as a transistor. Ultra-abrupt refers to a very steep semiconductor junction profile.

In an embodiment of the present invention, a transistor may have a gate with multiple surfaces, such as a trigate. In another embodiment of the present invention, the transistor may have multiple gates, such as a multiple-gate field effect transistor (MUGFET). For simplicity of exposition, a transistor with a single gate is described in the following disclosure.

First, a low energy ion implantation into a substrate, such as a wafer, may be used to adjust a threshold voltage, $V_t$, of a channel region of a transistor. In an embodiment of the present invention, the substrate may include a deep n-well or a deep p-well that is formed by a high energy ion implantation. In another embodiment of the present invention, the substrate may include silicon-on-insulator (SOI).

In an embodiment of the present invention, the transistor may be separated from another device by a shallow trench isolation (STI). In another embodiment of the present invention, the transistor formed in the SOI is a fully-depleted transistor.

A gate dielectric stack may be formed over the channel region. The gate dielectric may have a physical thickness of 0.6-1.5 nm. In an embodiment of the present invention, the gate dielectric may include SiON. In another embodiment of the present invention, the gate may include a high-k (dielectric constant, k, such as greater than 15) material, such as $HfO_2$.

A gate (electrode) may be formed over the gate dielectric. The gate may have a thickness of 40-65 nm. In an embodiment of the present invention, the gate may include doped polysilicon.

In another embodiment of the present invention, the gate may include a metal, such as Tantalum or Titanium for the NMOS transistor and Tantalum Nitride, Tungsten Nitride, or Titanium Nitride for the PMOS transistor. A barrier layer may be included at a certain interface to avoid interdiffusion, prevent oxidation, or improve adhesion.

Lithography and etch may be used to form the gate having a certain width. The width refers to a distance between two facing sides of the gate. The width may correspond to a physical gate length of 25-50 nm. In an embodiment of the present invention, an alternating phase-shifting mask is used with deep ultraviolet (DUV) light to define the gate in a chemically amplified photoresist. In another embodiment of the present invention, double patterning is used. The gate may be trimmed as needed to reduce the width.

During fabrication of the transistor, a raised source/drain may be formed adjacent to the two sides of the gate (electrode). First, a recess is etched (block 100 as shown in FIG. 1) in the regions adjacent to both sides of the gate of the transistor using the gate as an etch mask.

Next, a pre-amorphization implant (block 200), such as of Silicon or Germanium (Group IVA of the periodic table), may be performed into the recessed regions adjacent to both sides of the gate of the transistor. In an embodiment of the present invention, the pre-amorphization implant (PAI) is not performed into the recessed regions.

In an embodiment of the present invention, a Silicon pre-amorphization implant may have an energy of 5-15 keV. In another embodiment of the present invention, the Silicon preamorphization implant may have an energy of 15-45 keV. The dose for the Silicon pre-amorphization implant may be (0.4-2.5) E+15 atoms/$cm^2$.

In an embodiment of the present invention, a Germanium pre-amorphization implant may have an energy of 0.8-5 keV. In another embodiment of the present invention, the Germanium pre-amorphization implant may have an energy of 5.0-30 keV. The dose for the Germanium pre-amorphization implant may be (0.5-3.0) E+15 atoms/$cm^2$.

In an embodiment of the present invention, a spike anneal (block 250) is performed after the pre-amorphization implant and before one or more co-implants of one or more species. In another embodiment of the present invention, no anneal is performed between the pre-amorphization implant and the one or more co-implants of the one or more species.

Then, the one or more co-implants (block 310, 320) of the one or more species may be performed into the recessed regions under optimal conditions according to an embodiment of the present invention. Parameters for the one or more co-implants that may require adjusting, controlling, or optimizing a tool (equipment) or a process may include angle, energy, and dose. In a certain case, current (of the beam) may also be a critical parameter. In another case, an ionic species to be implanted may further be a critical parameter since energy, dose, and current may be affected by choice of a particular mass, charge, or mass-to-charge ratio.

Selection of an optimal angle for the ion implantation ensures a proper coverage for sidewall surfaces as well as a bottom surface of the recessed regions. An angled orientation refers to a tilt away from a perpendicular or normal incidence to an upper surface of the substrate. A 0-degree tilt away from the normal incidence corresponds to 90 degrees to the upper flat surface of the substrate.

In an embodiment of the present invention, an angled co-implant is performed at an angle selected from a range of 5-15 degrees tilt away from a normal incidence. In another embodiment of the present invention, the angled co-implant is performed at an angle selected from a range of 15-25 degrees tilt away from the normal incidence. In still another embodiment of the present invention, the angled co-implant is performed at an angle selected from a range of 25-35 degrees tilt away from the normal incidence. In yet another embodiment of the present invention, the co-implant is performed at several different angles to minimize any shadowing and asymmetry that may otherwise result from performing an implant at an angle or a tilt.

In an embodiment of the present invention, a single co-implant of a single species, such as Carbon (Group IVA of the periodic table), is performed into the recessed regions adjacent to both sides of the gate of the transistor.

Selection of an optimal energy ensures a proper depth below the surface for nominal placement of the Carbon (in an as-implanted profile). The Carbon should be located slightly deeper than the peak concentration of the subsequent Boron implant. In an embodiment of the present invention, the energy for the Carbon co-implant may be 1-3 keV. In another embodiment of the present invention, the energy for the Carbon co-implant may be 3-6 keV. In another embodiment of the present invention, the energy for the Carbon co-implant may be 6-10 keV.

Selection of an optimal dose (in 2 dimensions) to deliver the species, such as Carbon, to the substrate should ensure a proper concentration (in 3 dimensions) for nominal placement of the species, such as Carbon, (in an as-annealed profile). In an embodiment of the present invention, the dose for the Carbon co-implant may be $(0.5-2.0)$ E+15 atoms/cm$^2$. In an embodiment of the present invention, the peak concentration of Carbon may be $(1.0-4.0)$ E+19 atoms/cm$^3$.

In some cases, selection of an optimal current may confer one or more advantages such as improving uniformity, reducing charging, minimizing heating, avoiding damage, decreasing diffusion, and increasing throughput.

In an embodiment of the present invention, two or more co-implants of two or more species may be performed to customize a trapping zone for the dopant, such as Boron. In an embodiment of the present invention, the co-implanted species may be substitutional while the implanted dopant may be interstitial. In another embodiment of the present invention, a co-implant of Fluorine (Group VIIA of the periodic table) is performed before a co-implant of Carbon (Group IVA of the periodic table). In another embodiment of the present invention, the Fluorine co-implant is performed after the Carbon co-implant.

In an embodiment of the present invention, the co-implant may be performed in 2 steps with two different energies and two different doses to place the implanted species, such as Carbon, both slightly above and slightly below the Boron to surround (sandwich) the Boron and prevent it from diffusing.

In an embodiment of the present invention, a spike anneal (block 350) is performed after the one or more co-implants and before the filling of the recessed regions with Silicon-Germanium. In another embodiment of the present invention, no anneal is performed between the one or more co-implants and the filling of the recessed regions, such as with Silicon-Germanium.

Next, the recessed regions adjacent to both sides of the gate (electrode) of the transistor may be filled (block 400). In an embodiment of the present invention, the recessed regions may be filled using selective epitaxial deposition.

In an embodiment of the present invention, the recessed regions may be filled with Silicon-Germanium (Group IVA of the periodic table). A film or layer of SiGe will enhance carrier mobility and thus improve transistor performance. The Silicon-Germanium may be doped intrinsically, such as during deposition, or extrinsically, such as with an implant.

In an embodiment of the present invention, the recessed regions may be filled to form a raised source/drain. In an embodiment of the present invention, the recessed regions may be overfilled to a desired thickness or height.

In an embodiment of the present invention, a dopant may be used to dope a tip or source/drain extension (block 500) adjacent to both sides of the gate (electrode) of the transistor. In particular, Boron (Group IIIA of the periodic table) may be used to dope the tip or source/drain extension (SDE) in the PMOS transistor while Arsenic or Phosphorus (Group VA of the periodic table) may be used to dope the tip or source/drain extension in the NMOS transistor. The tip or source/drain extension ion implant for Boron may have an energy of 200-750 eV and a dose of $(0.5-2.0)$ E+15 atoms/cm$^2$. The tip or source/drain extension ion implant for Phosphorus may have an energy of 400-1,500 eV and a dose of $(2.5-9.0)$ E+14 atoms/cm$^2$.

The source/drain extension is shallow and may have a junction depth of 10-20 nm. In an embodiment of the present invention, the tip or source/drain extension may be formed with an ultra-low energy implant. The tip or source/drain implant may be an angled or tilted implant. In an embodiment of the present invention, plasma or gas phase doping may be used to form the tip or source/drain extension.

An anneal (block 550) is performed after an ion implantation to activate a dopant and to remove damage. The damage may include point defects and stresses in the substrate. In an embodiment of the present invention, the anneal is performed at a temperature selected from a range of 980-1,030 degrees C. In another embodiment of the present invention, the anneal is performed at a temperature selected from a range of 1,030-1,080 degrees C. In another embodiment of the present invention, the anneal is performed at a temperature selected from a range of 1,080-1,130 degrees C.

Annealing for a very short duration helps to minimize diffusion of dopant. In an embodiment of the present invention, the anneal is a spike anneal. In another embodiment of the present invention, the anneal is a rapid thermal anneal (RTA).

The Boron atom has a small size. Boron forms clusters interstitially and diffuses through interstitial motion. Transient-enhanced diffusion (TED) of Boron results in fast diffusion.

According to an embodiment of the present invention, placing the Carbon slightly below (deeper than) the peak concentration of Boron will arrest, retard, or suppress the out-diffusion of Boron through the SiGe and into the adjacent or underlying substrate.

In another embodiment of the present invention, the Carbon may be placed both slightly above (shallower than) and slightly below (deeper than) the peak concentration of the Boron to surround (sandwich) the Boron and prevent it from diffusing.

The substitutional Carbon acts as a trap for the Boron interstitials in the SiGe. However, selecting a too low dose for the Carbon implant may not confer sufficient benefit while selecting a too high dose for the Carbon implant may damage a structure of the substrate unnecessarily.

Out-diffusion refers to an excessive movement of a dopant away from an as-implanted (original) location due to a driving force such as a concentration gradient or a thermal gradient. In an embodiment of the present invention, the out-diffusion of Boron in the PMOS transistor beyond the original as-implanted depth should be 1.5-3.0 nm. In another embodiment of the present invention, the out-diffusion of Boron in the PMOS transistor beyond the original as-implanted depth should be 3.0-6.0 nm.

An apparatus, structure, or device envisioned in various embodiments of the present invention may include a tip or source/drain extension having an ultra-abrupt semiconductor junction profile. The ultra-abrupt semiconductor junction profile is formed due to a trapping of an interstitial dopant, such as Boron, by a substitutional co-implanted species, such as Carbon.

In an embodiment of the present invention, the co-implanted species, such as Carbon, may be located slightly below (deeper than) the peak concentration of the dopant, such as Boron, in the apparatus to block the Boron and prevent it from diffusing.

In another embodiment of the present invention, the co-implanted species, such as Carbon, may be located both slightly above (shallower than) and slightly below (deeper than) the peak concentration of the dopant, such as Boron, in the apparatus to surround (sandwich) the Boron and prevent it from diffusing.

In an embodiment of the present invention, the ultra-abrupt semiconductor junction profile in the apparatus may have a slope of 3-5 nm/decade. In another embodiment of the present invention, the ultra-abrupt semiconductor junction profile in the apparatus may have a slope of 5-7 nm/decade.

Secondary ion mass spectroscopy (SIMS) is a destructive analytical technique that may be performed over a sufficiently large area of a sample to determine a vertical profile of concentration as a function of depth. The profile may include a characteristic slope, peak, shoulder, and tail.

In an embodiment of the present invention, the Boron in the tip or the source/drain extension of the PMOS transistor may have a peak concentration of $(0.7-3.0)$ E+20 atoms/cm$^3$. In another embodiment of the present invention, the Boron may have a peak concentration of $(0.3-1.2)$ E+21 atoms/cm$^3$. In an embodiment of the present invention, the junction depth ($X_j$) may be 12-18 nm. In another embodiment of the present invention, the junction depth may be 18-27 nm.

In an embodiment of the present invention, the Phosphorus in the tip or the source/drain extension of the NMOS transistor may have a peak concentration of $(0.6-5.0)$ E+20 atoms/cm$^3$. In another embodiment of the present invention, the Phosphorus may have a peak concentration of $(0.5-4.0)$ E+21 atoms/cm$^3$. In an embodiment of the present invention, the junction depth ($X_j$) may be 8-12 nm. In another embodiment of the present invention, the junction depth may be 12-18 nm.

Scanning spreading resistance microscopy (SSRM) is a technique that may be used to determine a 2-dimensional profile of activated carrier concentration.

Formation of an ultra-abrupt semiconductor junction profile will improve performance (switching speed) of the transistor. A shallower junction depth may be achieved due to a decrease in vertical diffusion. An overlap capacitance ($C_{ov}$) between the gate (electrode) and the source/drain extension may be reduced due to a decrease in lateral diffusion. A source/drain (series) resistance may be reduced due to improved dopant activation. A drive current ($I_{on}$) for a given drain voltage may be increased due to improved dopant activation. Short channel effects (SCE) may be mitigated by improved dopant activation.

In an embodiment of the present invention, a halo implant is performed after the tip or the source/drain extension implant. In another embodiment of the present invention, the halo implant is performed before the tip or the source/drain extension implant. Reversing the sequence of implants may further reduce diffusion of Boron.

Sidewall spacers may be formed by chemical vapor deposition along the two facing sides of the gate. The sidewall spacer may have a thickness after etch of 25-80 nm. In an embodiment of the present invention, the spacers may include two layers of dielectric material, including SiON.

The SiGe is heavily doped to form a raised source/drain using the gate and the sidewall spacers as a mask. An ultra-low energy ion implantation may be used to dope the raised source/drain. Alternatively, plasma or gas phase doping may be used to dope the raised source/drain. The raised source/drain may have a junction depth of 20-40 nm.

In an embodiment of the present invention, the doped polysilicon gate and the source/drain may be capped with an overlying layer of Nickel Silicide. The Nickel Silicide may have a thickness of 15-25 nm. In some cases, the gate may be fully silicided (FUSI). In another embodiment of the present invention, a metal gate may be used.

An interlayer dielectric (ILD) may be formed over the transistor. The ILD may be formed from a low-k (dielectric constant, k, such as 1.0-2.2) material that is formed by spin coating or chemical vapor deposition (CVD) of a material, such as organosilicate glass (OSG) or carbon-doped oxide (CDO). The ILD may be porous and may include an air gap.

A dual Damascene scheme may be used to form multilayer interconnects to the transistor with copper metal or alloy. As needed, diffusion barrier layers and shunt layers may be included for the vias and metal lines in each layer. Between 3 and 10 layers of interconnects may be formed.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

Figure 2:
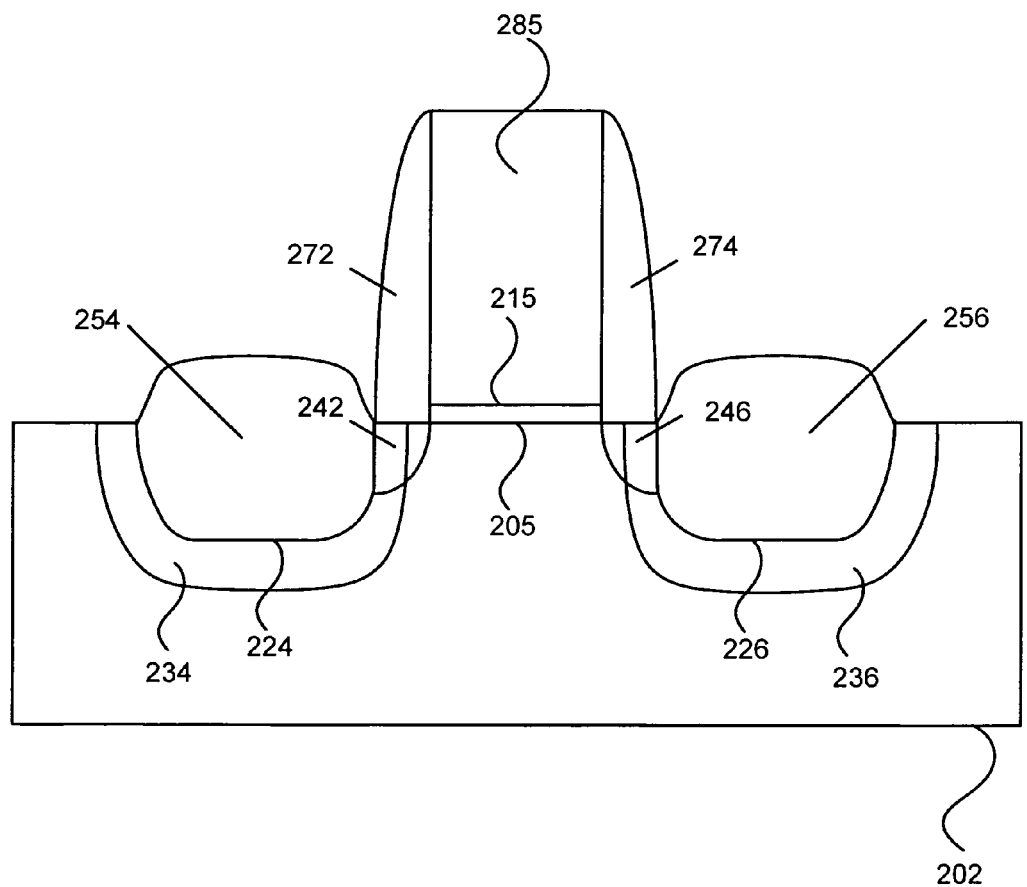
FIG. 2 is a schematic cross-sectional side view of a transistor formed on a portion of the substrate having a gate dielectric, a gate electrode, sidewall spacers, source/drain extensions, co-implanted recessed regions on both sides of the gate, and filled recessed regions on both sides of the gate.

FIG. 2 is a cross-sectional side view of a transistor formed on a portion of the substrate 202. A gate dielectric stack 215 may be formed over the surface of the channel region 205. A gate electrode 285 may be formed over the channel region. Source/drain extension regions 242 and 246 may be formed adjacent to both sides of a gate electrode 285. Sidewall spacers 272 and 274 may be formed along the two sides of the gate 285. Prior to the first co-immplant, recessed regions 224 and 226 may be formed on both sides of the gate 285. A co-implant or co-implants may form co-implanted regions 234 and 236. The recessed regions 224 and 234 may be filled with Silicon-Germanium 254 and 256. The Silicon-Germanium 254 and 256 may be overfilled to a desired thickness or height.

We claim:

1. A method comprising:
   etching recessed regions adjacent to both sides of a gate in a substrate;
   performing a first co-implant and a second co-implant of a species into said recessed regions;
   filling said recessed regions after performing said first co-implant and said second co-implant; and
   forming source/drain extensions adjacent to both sides of said gate with a dopant wherein said co-implanted species is disposed above and below a peak concentration of said dopant.

2. The method of claim 1 wherein said species is Carbon.

3. The method of claim 1 wherein said dopant is Boron.

4. The method of claim 1 wherein said first co-implant and said second co-implant are performed at an angle selected from a range of 15-25 degrees tilt away from a normal incidence to an upper flat surface of said substrate.

5. The method of claim 1 further comprising performing a pre-amorphization implant into said recessed regions prior to performing said first co-implant and said second co-implant.

6. The method of claim 5 further comprising performing a spike anneal after said pre-amorphization implant and before said first co-implant and said second co-implant.

7. The method of claim 1 wherein the recessed regions are filled with a material comprising Silicon-Germanium.

8. The method of claim 1 wherein said first co-implant is performed at an angle selected from a range of 15-25 degrees tilt away from a normal incidence to an upper flat surface of the substrate.

9. The method of claim 1 wherein the recessed region is overfilled to form a raised source/drain.

* * * * *